United States Patent
Bulzacchelli et al.

(10) Patent No.: US 8,755,220 B2
(45) Date of Patent: *Jun. 17, 2014

(54) HYBRID SUPERCONDUCTING-MAGNETIC MEMORY CELL AND ARRAY

(71) Applicant: International Business Machines Corporation, Armonk, NY (US)

(72) Inventors: John F. Bulzacchelli, Yonkers, NY (US); William J. Gallagher, Ardsley, NY (US); Mark B. Ketchen, Hadley, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/943,356

(22) Filed: Jul. 16, 2013

(65) Prior Publication Data

US 2013/0303379 A1 Nov. 14, 2013

Related U.S. Application Data

(63) Continuation of application No. 13/346,847, filed on Jan. 10, 2012, now Pat. No. 8,547,732, which is a continuation of application No. 12/056,788, filed on Mar. 27, 2008, now Pat. No. 8,208,288.

(51) Int. Cl.
*G11C 11/00* (2006.01)

(52) U.S. Cl.
USPC ......... 365/158; 365/32; 365/33; 365/46; 365/55; 365/66; 365/160; 365/162; 365/171; 365/189.19; 365/189.07; 365/189.011; 365/225.5; 365/233.16; 365/233.17

(58) Field of Classification Search
USPC ......... 365/32, 33, 46, 55, 66, 158, 160, 162, 365/171, 189.19, 189.07, 189.011, 225.5, 365/233.16, 233.17
See application file for complete search history.

(56) References Cited

U.S. PATENT DOCUMENTS

| | | | |
|---|---|---|---|
| 7,342,396 B2 | 3/2008 | Pannetier et al. | |
| 7,826,253 B2 | 11/2010 | Takeda | |
| 8,208,288 B2 | 6/2012 | Bulzacchelli et al. | |
| 2002/0080646 A1 | 6/2002 | Hidaka | |
| 2007/0053112 A1 | 3/2007 | Papworth Parkin | |
| 2007/0117315 A1 | 5/2007 | Lai et al. | |
| 2008/0006814 A1 | 1/2008 | Hsu et al. | |
| 2008/0026234 A1 | 1/2008 | Sambasivan et al. | |
| 2012/0108434 A1 | 5/2012 | Bulzacchelli et al. | |

*Primary Examiner* — Fernando Hildalgo
(74) *Attorney, Agent, or Firm* — Vazken Alexanian

(57) ABSTRACT

In one embodiment, the invention is a hybrid superconducting-magnetic memory cell and array. One embodiment of a memory cell includes a magnetoresistive element and at least one superconducting element wired in parallel with the magnetoresistive element. In a further embodiment, memory cells of the disclosed configuration are arranged to form a memory array.

20 Claims, 7 Drawing Sheets

US 8,755,220 B2

HYBRID SUPERCONDUCTING-MAGNETIC MEMORY CELL AND ARRAY

CROSS REFERENCE TO RELATED APPLICATIONS

This application is a continuation of co-pending U.S. patent application Ser. No. 13/346,847, filed Jan. 10, 2012, which in turn is a continuation of U.S. patent application Ser. No. 12/056,788, filed Mar. 27, 2008 (now U.S. Pat. No. 8,208,288). Both of these applications are herein incorporated by reference in their entireties.

BACKGROUND OF THE INVENTION

The present invention relates generally to magnetic memory, and more specifically relates to hybrid magnetic memory including a magnetoresistive element and a superconducting element.

Superconducting technology such as that based on Josephson junctions has long seemed promising for implementing high-performance computer systems due to: (1) the very fast switching of superconducting elements; and (2) the low power dissipation of superconducting elements relative to semiconductor circuits (e.g., complementary metal-oxide-semiconductor (CMOS)).

The development of superconducting technology for general-purpose computing applications, however, has been largely impeded by the lack of dense, fast, and high capacity (i.e., high bit count) random access memory (RAM). Without a high capacity and low access-time memory to feed it data, a processor (especially a processor operating at the clock rates supported by superconducting logic) would be continually starved of data on which to work, thereby wasting the processor's potential computational power.

One possible solution to overcoming this lack of adequate memory in superconducting technology is to develop a hybrid chip technology, in which, for example, fast Josephson logic circuits are integrated (on the same chip) with dense memory storage elements implemented in another technology (e.g., CMOS). However, the complex level-translation circuits that are required to convert the small voltage pulses produced by the superconducting logic circuits (mV level) to the volt-level signals needed to control the memory array tend to dissipate a great deal of power and to introduce significant delay to the memory access time.

Thus, there is a need in the art for a new memory cell and array that can be interfaced with superconducting logic without complex level-translation circuits (and their associated drawbacks).

SUMMARY OF THE INVENTION

In one embodiment, the invention is a hybrid superconducting-magnetic memory cell and array. One embodiment of a memory cell includes a magnetoresistive element and at least one superconducting element wired in parallel with the magnetoresistive element. In a further embodiment, memory cells of the disclosed configuration are arranged to form a memory array.

BRIEF DESCRIPTION OF THE DRAWINGS

So that the manner in which the above recited features of the present invention can be understood in detail, a more particular description of the invention, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

One embodiment of the invention provides a Josephson magnetic random access memory array in which each cell of the array comprises a magnetoresistive element, such as a magnetic tunnel junction, and a superconducting element, such as a Josephson junction or a superconducting quantum interference device, wired in parallel. In a further embodiment, a string of these cells is wired in series along the read bit line to form one column of a memory array. In a further embodiment still, a two-dimensional memory array is formed by placing a number of such strings adjacent to each other, along with appropriate word lines for reading and writing.

Figure 1:
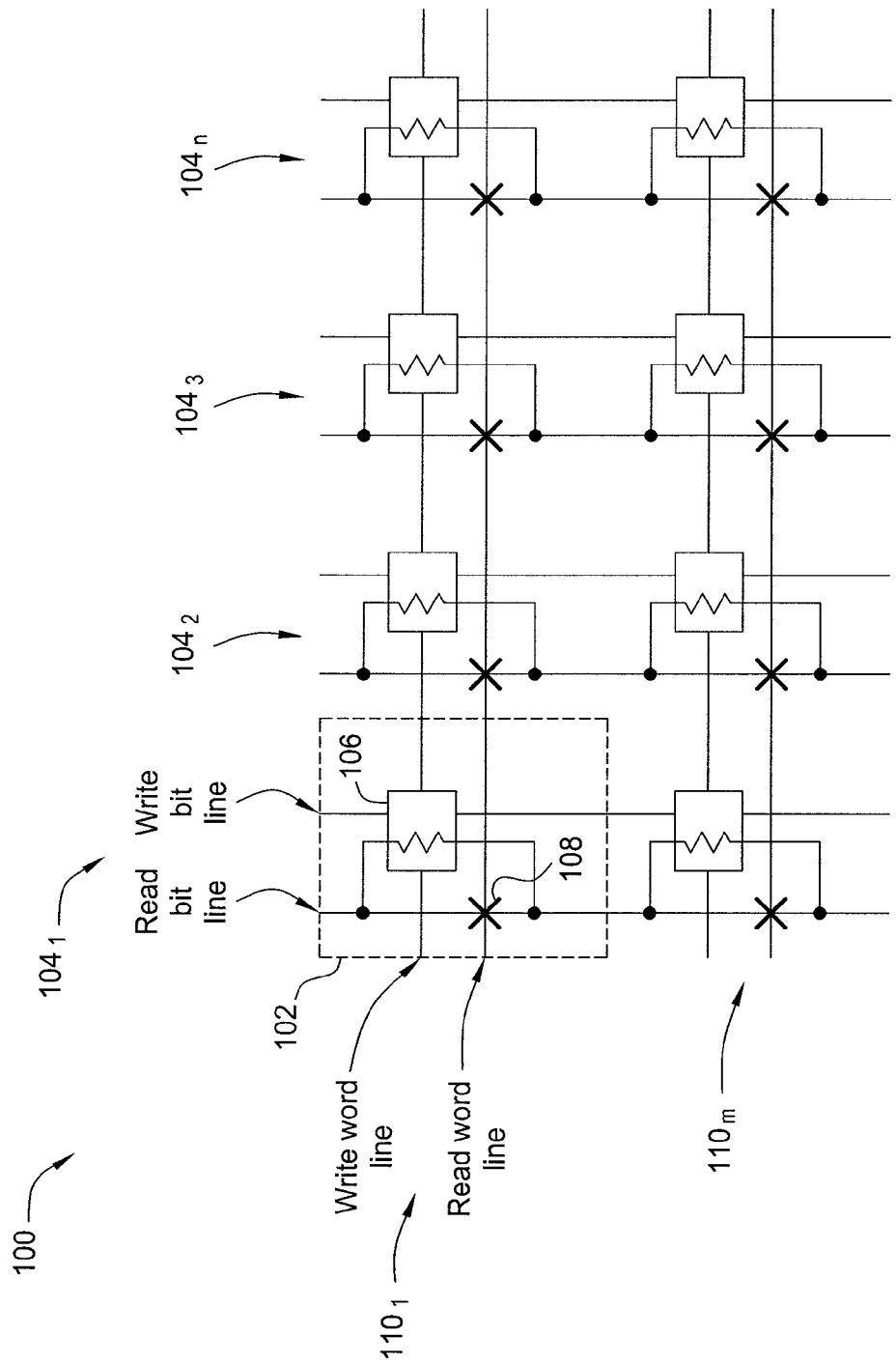
FIG. 1 is a schematic diagram illustrating a first embodiment of a magnetic random access memory array, according to the present invention.

FIG. 1 is a schematic diagram illustrating a first embodiment of a magnetic random access memory (MRAM) array 100, according to the present invention. In one embodiment, the MRAM array 100 is a two-dimensional array.

As illustrated, the MRAM array 100 comprises a plurality of memory cells, an exemplary one of which is designated as memory cell 102. As illustrated, a first plurality of these memory cells is wired in series along the read bit line to form one column of the MRAM array 100 (see, e.g., exemplary column $104_1$). Two or more of these columns $104_1$-$104_n$ (hereinafter collectively referred to as "columns 104") are then positioned adjacent to each other, along with appropriate write word lines and read word lines along each resultant row $110_1$-$110_m$ (hereinafter collectively referred to as "rows 110"), to form the two-dimensional MRAM array 100.

In one embodiment, each memory cell in the MRAM array 100 is configured in accordance with the exemplary memory cell 102. Thus, each memory cell comprises a magnetoresistive element 106 wired in parallel with a superconducting element 108. In one embodiment, the magnetoresistive element 106 comprises a magnetic tunnel junction (MTJ), and the superconducting element 108 comprises a Josephson junction.

Writing of a memory cell in the MRAM array 100 is accomplished by applying word- and bit-line write current pulses that couple magnetic fields into the memory cell's magnetoresistive element 106. Magnetic field pulses driven by pulses with the proper amplitude and timing will write the memory cell at the intersection point of the two current lines, but the fields do not disturb the memory cells that are only accessed by one of the write wires. One or both of the currents are electrically isolated from the memory cells, so there are no low resistance paths through the MRAM array 100 that divert current from one direction to the other and interfere with reliable writing within the MRAM array 100. It is to be noted that although the write word line is described as a separate wiring line from the read word line, it is possible in other embodiments to have one word line instead of two, where the one word line serves both the read and write operations.

The resistance of a superconducting element 108 in the superconducting state is exactly zero and is therefore much lower than the resistance of a magnetoresistive element 106. The MRAM array 100 puts this observation to advantage by suppressing the critical current of the superconducting element 108 in a cell to be accessed (i.e., driving the superconducting element 108 out of its zero resistance state), ultimately isolating the access of the magnetoresistance in the cell's row 110 from the magnetoresistances of the other rows 110.

For instance, accessing a memory cell in the MRAM array 100 for readout is accomplished as follows. For each row 110, the read word line is magnetically coupled to the superconducting elements 108 in the row 110. Accordingly, application of (nonzero) current to the read word line of a row 110 to be accessed suppresses the critical currents of the superconducting elements 108 in the row 110. With their critical currents suppressed, the superconducting elements 108 in the row 110 are driven out of the superconducting state, and the resistances of the magnetoresistive elements 106 in the row contribute to the resistances measured across the respective read bit lines. No currents are applied to the read word lines of the rows 110 not being accessed, so the superconducting elements 108 in those rows 110 have large critical currents and remain in the superconducting state. Since the superconducting elements 108 in the rows 110 not accessed form perfect (i.e., zero resistance) shorts across their respective magnetoresistive elements 106, the resistances of those magnetoresistive elements 106 have no effect on the resistances measured across the read bit lines. In this way, the superconducting elements 108 connected in parallel with the magnetoresistive elements 106 provide the desired isolation between rows 110 during readout. Since the wiring itself is superconducting and has no series resistance, the resistance measured across a read bit line exactly equals the resistance of the memory cell in the row 110 being accessed, allowing the binary state of that memory cell to be reliably detected.

In accordance with well-known resistance measurement techniques, the resistance of the read bit line can be measured by applying a voltage across the read bit line and detecting the resulting current, or alternatively, by applying a current to the read bit line and detecting the resulting voltage drop. While both schemes can be implemented with Josephson circuits, the former scheme is a more natural choice as current comparators are more common than voltage comparators in Josephson technology.

Figure 2:
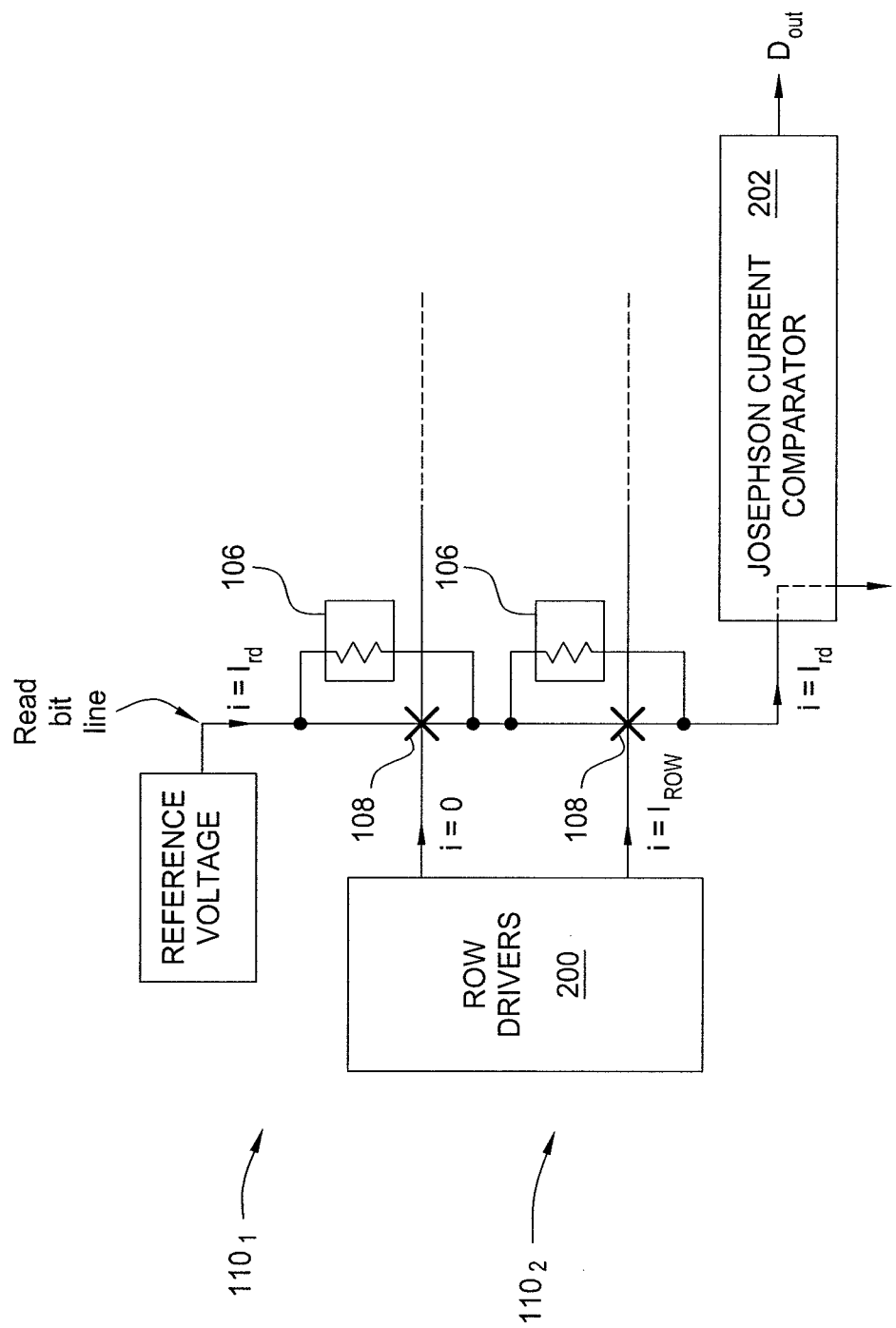
FIG. 2 is a schematic diagram illustrating one embodiment of a method for reading out a bit stored in the second row of the magnetic random access memory array of FIG. 1, using a Josephson current comparator.

FIG. 2, for example, is a schematic diagram illustrating one embodiment of a method for reading out a bit stored in the second row of the MRAM array 100 of FIG. 1, using a Josephson current comparator 202. Thus, the method illustrated in FIG. 2 may be used to advantage when the superconducting element 108 used in the MRAM array 100 is a Josephson junction. For the sake of clarity, only one column of the MRAM array 100 is shown.

As discussed above, a row (e.g., row $110_2$) is selected for readout by applying a current (e.g., $I_{row}$) to the row's read word line, which suppresses the critical currents of the Josephson junctions 108 in that row $110_2$. Since data writing and selection in purely Josephson memories are accomplished by applying direct current onto superconducting microstrip lines, Josephson circuits for realizing the row drivers 200 of the MRAM array 100 are well-known to those skilled in the art.

No current is applied to the read word line of the first row $110_1$, so the Josephson junctions 108 in the first row $110_1$ have a large critical current. This large critical current is chosen to be higher than the current ($I_{rd}$) that flows along the read bit line during readout, so the Josephson junctions 108 in the first row $110_1$ remain in the superconducting state.

In one embodiment, a reference voltage is applied to a first end of the read bit line. A very accurate voltage reference can be generated with on-chip Josephson circuitry. In another embodiment, the reference voltage is supplied from an off-chip source. The second end of the read bit line is connected to a Josephson current comparator 202. Because a Josephson current comparator typically has zero input resistance, the second end of the read bit line is essentially shorted to ground (i.e., at zero potential). The magnitude $I_{rd}$ of the current flowing into the Josephson current comparator 202 is limited by the resistance of the memory cell in the row $110_2$. The threshold of the Josephson current comparator 202 is set so that its binary output is a reliable indicator of the data stored in the memory cell. In particular, if the magnetoresistive element 106 of that cell is in the high resistance state, $I_{rd}$ will be below the Josephson current comparator's threshold, and the Josephson current comparator 202 will produce a binary zero; if the magnetoresistive element 106 of that cell is in the low resistance state, $I_{rd}$ will be above the Josephson current comparator's threshold, and the Josephson current comparator 202 will produce a binary one.

The arrangement shown in FIG. 2 for readout of a memory cell is only one representative example. Other modifications and variations can be made to this arrangement without departing from the spirit and scope of the present invention. For instance, the current $I_{rd}$ does not have to be sensed at the grounded end of the read bit line. As is well-known to those skilled in the art, Josephson circuits, especially SQUIDs, are sensitive detectors of magnetic fields. Since the current $I_{rd}$ generates a magnetic field in the vicinity of the read bit line, the magnitude of $I_{rd}$ can be detected anywhere along the read bit line by an inductive coupling to a Josephson circuit (as opposed to the direct coupling depicted in FIG. 2). In another embodiment, a pulsed voltage is used instead of a DC voltage as the reference voltage applied to the read bit line. Such pulsed voltages are readily generated by Josephson logic circuits, such as those belonging to the rapid single flux quantum (RSFQ) logic family. If a pulsed voltage is used as the reference voltage, the pulsed voltage's timing must be synchronized with the timing of the Josephson current comparator 202 shown in FIG. 2 so that the resulting current pulse $I_{rd}$ is sampled at the correct time.

Figure 3:
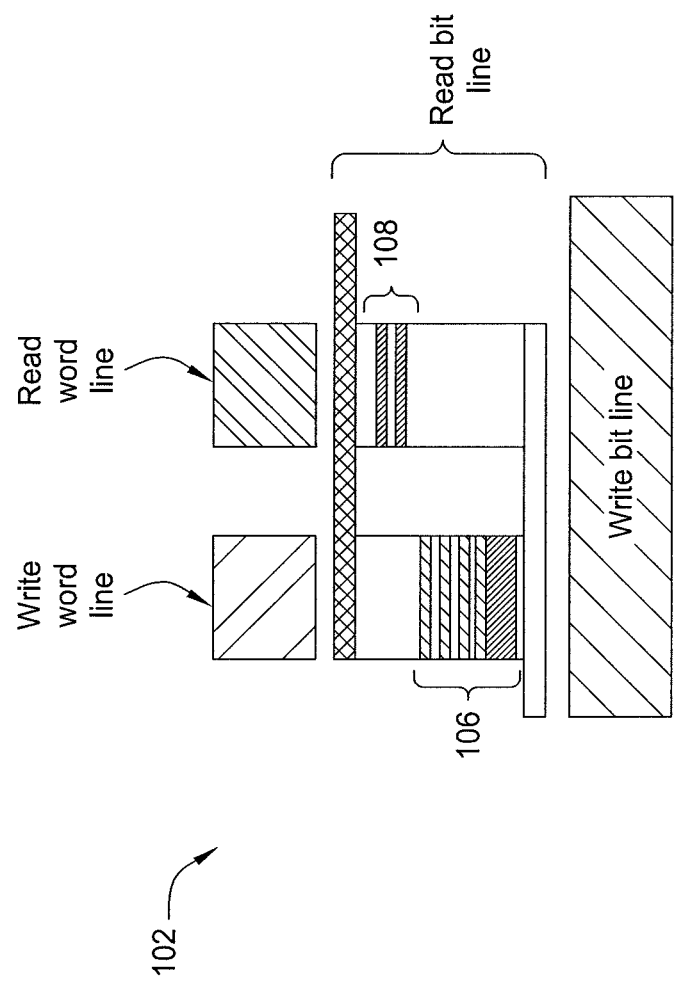
FIG. 3 is a cross-sectional diagram illustrating the magnetic memory cell of FIG. 1 along the bit line direction.

FIG. 3 is a cross-sectional diagram illustrating the magnetic memory cell 102 of FIG. 1 along the bit line direction. As illustrated, there are separate word lines and bit lines for the read and write operations. During the read operation, the read word line applies a magnetic field to the superconducting element 108 in the cell 102 to cause the superconducting element 108 to transition from the zero-resistance state to the resistive state as described above. During the write operation, the write word line applies a magnetic field on the magnetoresistive element 106 that can cause the storage magnetic layer to reverse direction. Typical read currents along the bit line direction will be in the range of 10 to 200 µA, while word line currents will be in the range of 0.5 to 10 mA, with the current requirement for the read word line generally being lower than that for the write word line. In other embodiments the word lines might have magnetic or superconductive liners around the side and top surfaces (e.g., for the orientation discussed in further detail with respect to FIGS. 4 and 5) that cause the magnetic flux to be more concentrated under this wire, serving both to enhance the field applied to the storage layer in the cell 102 and to apply less stray field to neighboring cells. In still other embodiments it is possible for the cell 102 to have one word line instead of two, where the one word line serves for both the read and write operations.

Figure 4:
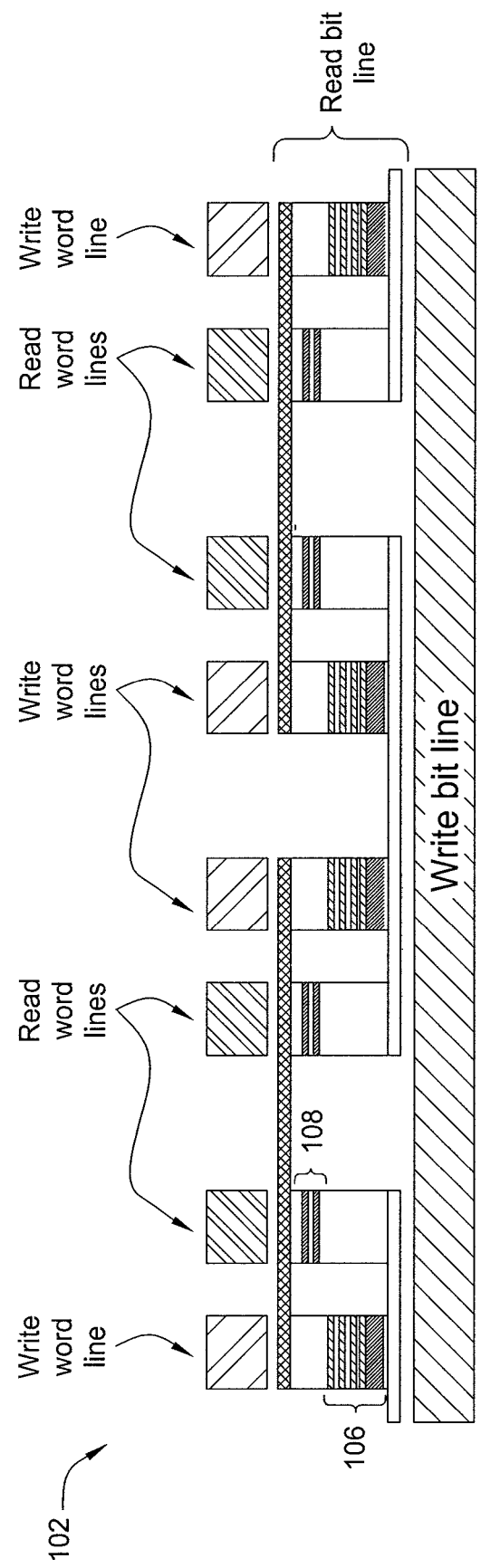
FIG. 4 is a cross sectional diagram illustrating a first configuration of the memory array of FIG. 1, cut along the bit-line direction.

To form a memory array such as the memory array 100, the cell structure in FIG. 3 is mirrored along the bit-line direction, and then strung together in repeated units in a manner well known to those skilled in the art. FIG. 4, for example, is a cross sectional diagram illustrating a first configuration of the memory array 100 of FIG. 1, cut along the bit-line direction. The array configuration of FIG. 4 is for a higher density arrangement where adjacent cells have their arrangements mirror reflected about a vertical line. In the embodiment illustrated in FIG. 4, current flows from the left (e.g., cell 102) and upward through the magnetoresistive element 106 and the superconducting element 108, then over to the next cell and downward, then upward again through the next cell, etc.

Figure 5:
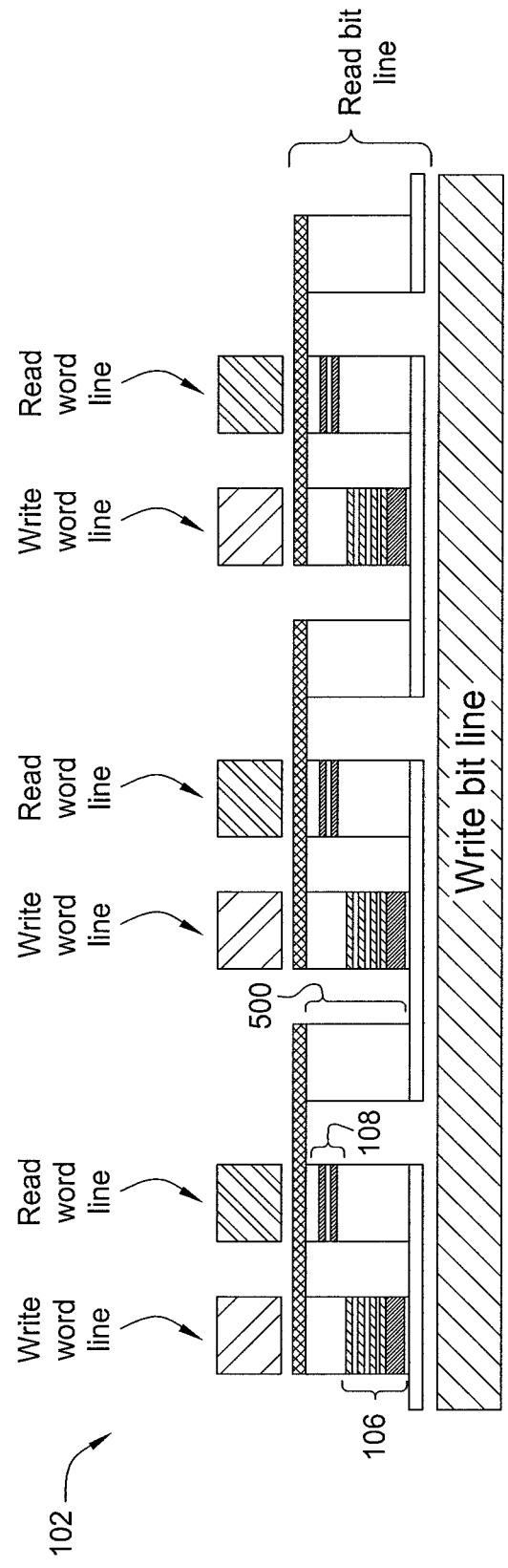
FIG. 5 is a cross sectional diagram illustrating a second configuration of the memory array of FIG. 1, in which the memory array comprises cells of a geometry that is stepped from one cell to the next.

FIG. 5 is a cross sectional diagram illustrating a second configuration of the memory array 100 of FIG. 1, in which the memory array 100 comprises cells of a geometry that is stepped from one cell to the next. The stepped arrangement involves the introduction of an additional via 500 between the top and bottom wiring layers of each cell and is of lower density than the mirrored arrangement illustrated in FIG. 4. The addition of the vias 500 allows current to flow through each cell in the same direction (e.g., from the left and upward through the magnetoresistive element 106 and the superconducting element 108, then down the via and over to the next cell and upward again, etc.). There are sometimes process yield advantages for stepped arrays, as misalignments of layers will produce the identical effects on every cell.

Figure 6:
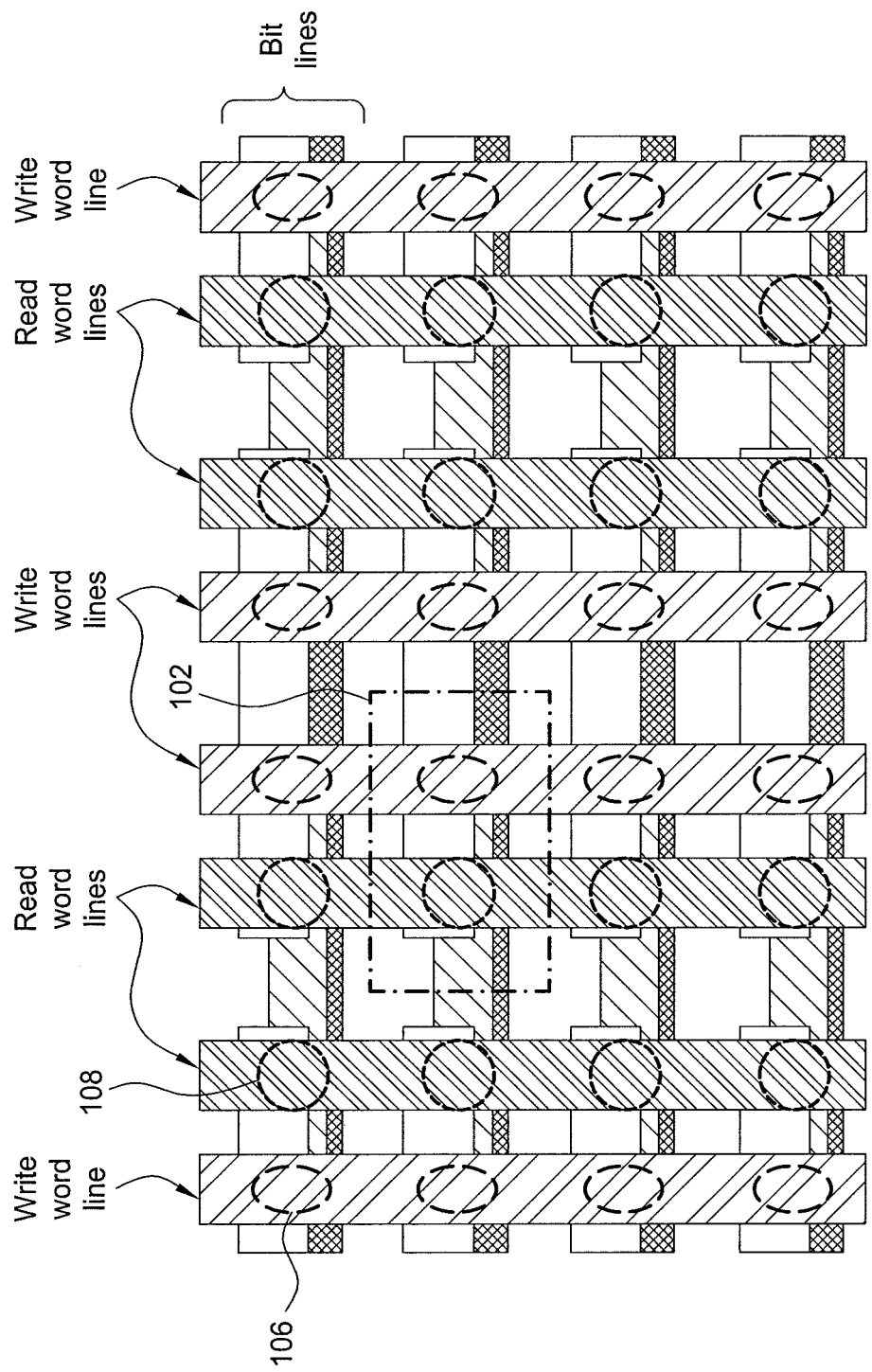
FIG. 6 is a top down illustration of the memory array illustrated in cross-section in FIG. 4.

FIG. 6 is a top down illustration of the memory array 100 illustrated in cross-section in FIG. 4. In FIG. 6 a dash-dot line encloses one memory cell 102. Also in this figure, the bit line components are off-set slightly from one another for illustrative purposes. It is noted that the top-down structural array illustration in FIG. 6 is rotated ninety degrees relative to the electrical array schematic shown in FIG. 1.

In a read operation, a current of magnitude sufficient to put one flux quantum $\Phi_0$ of flux into the superconducting element 108 is used in the read word line (in one embodiment, the current is several milliamps). Along the bit line direction, the read current through the series connection of parallel magnetoresistive elements 106 and superconducting elements 108 would in one embodiment be of order approximately 10 microamps (e.g., 3 mV from the voltage source flowing into roughly 300 ohms). This current would flow through all of the superconducting elements 108 except for in the cell selected by the read word line, where the current would flow in parallel though the magnetoresistive element 106 and the resistive superconducting element 108.

In one embodiment, resistance values for the magnetoresistive element 106 will be of approximately order 160 ohms and approximately 280 ohms for the parallel and antiparallel magnetization storage directions respectively. These values correspond roughly to those for a magnetic tunnel junction with a resistance area product of ten ohm-m$^2$ and a tunneling magnetoresistance of eighty percent at 4.2 Kelvin. In one embodiment, a Josephson junction would have a normal state resistance of about sixty ohms and a subgap resistance of 800 ohms. The read current flow would thus be split between the parallel resistance of the magnetoresistive element 106 and the subgap resistance of the superconducting element 108 (i.e., in this case a Josephson tunnel junction). For a 3 mV supply voltage, there would be 22.5 microamps flowing in the case of parallel alignment and 14.5 microamps for the antiparallel alignment, a value difference easily detected by the current comparator 202 illustrated in FIG. 2.

Figure 7:
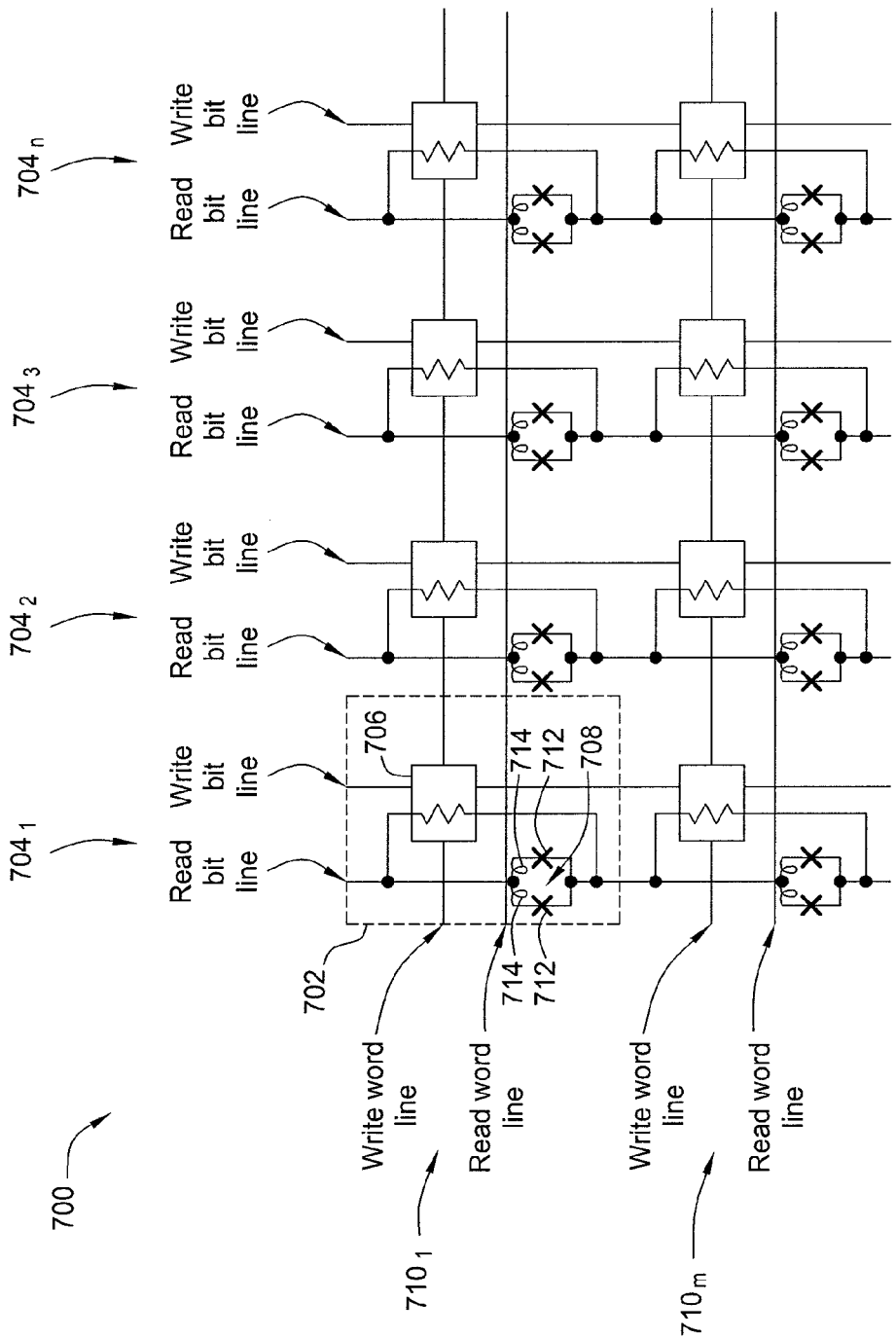
FIG. 7 is a schematic diagram illustrating a second embodiment of a magnetic random access memory array, according to the present invention.

FIG. 7 is a schematic diagram illustrating a second embodiment of an MRAM array 700, according to the present invention. In one embodiment, the MRAM array 700 is a two-dimensional array.

As illustrated, the MRAM array 700 is configured in a manner substantially similar to the MRAM array 100 illustrated in FIG. 1 and comprises a plurality of memory cells, an exemplary one of which is designated as memory cell 702. As illustrated, a first plurality of these memory cells is wired in series along the read bit line to form one column of the MRAM array 700 (see, e.g., exemplary column $704_1$). Two or more of these columns $704_1$-$704_n$ (hereinafter collectively referred to as "columns 704") are then positioned adjacent to each other, along with appropriate write word lines and read word lines along each resultant row $710_1$-$710_n$, (hereinafter collectively referred to as "rows 710"), to form the two-dimensional MRAM array 700.

In one embodiment, each memory cell in the MRAM array 700 is configured in accordance with the exemplary memory cell 702. Thus, each memory cell comprises a magnetoresistive element 706 wired in parallel with a superconducting element 708. In one embodiment, the magnetoresistive element 706 comprises a magnetic tunnel junction (MTJ), and the superconducting element 708 comprises a multi junction SQUID. In the illustrated embodiment, each of the multi-junction SQUIDs is formed by one or more superconducting loops comprising Josephson junctions 712 and inductors 714.

In this case, the read word lines are arranged so that the read word lines couple magnetic field not primarily into the Josephson junctions 712 themselves, but mostly into the inductive loops 714 of the SQUID. When no current is applied to the read word line, zero magnetic flux is coupled into the SQUID loop 714, and the critical current of the SQUID is at its maximum (equal to $2I_c$, where $I_c$ is the critical current of each individual Josephson junction 712 in the SQUID). Since their critical currents are high, the SQUIDs in this (unselected) row remain in the superconducting state and form perfect (zero resistance) shorts across their respective magnetoresistive elements. When nonzero current is applied to the read word line, magnetic flux is coupled into the SQUID loop 714. If the applied current is set so that the magnetic flux coupled into the SQUID loop 714 is $\Phi_0/2$, the critical current of the SQUID is suppressed to a minimum value. In fact, the critical current is suppressed to a minimum value for all odd multiples of $\Phi_0/2$, but $\Phi_0/2$ is the best choice for minimizing read word line currents.

With their critical currents suppressed, the SQUIDs in the selected row (i.e., the row being accessed for readout) are driven out of the superconducting state, and the resistances of the magnetoresistive elements 706 in the selected row contribute to the resistances measured across the magnetoresistive elements' respective read bit lines. Hence, the MRAM array 700 of FIG. 7 shares the same operating principles with the MRAM array 100 illustrated in FIG. 1.

One possible advantage of using a double-junction SQUID (i.e., as illustrated in FIG. 7) over a single Josephson junction (i.e., as illustrated in FIG. 1) in each memory cell is that lower read word line currents can be employed, since the critical current of a SQUID is more sensitive to applied magnetic field than the critical current of a single Josephson junction. On the other hand, a memory cell which includes a SQUID is more complex, so the density of the memory array is reduced somewhat. For example, in the array layout illustrated in FIG. 6, it would be most convenient to lay out the two Josephson junctions of the SQUID along the word line direction, increasing the cell area by approximately a factor of two.

Although the magnetoresistive element in each memory cell has been described herein as an MTJ, those skilled in the art will appreciate that the magnetoresistive element could comprise substantially any type of two-terminal magnetoresistive element without departing from the spirit and scope of the present invention as the fundamental operating principle (i.e., shunting a magnetoresistive element with a superconducting device having a controllable critical current for row selection during readout) remains the same. Since the MTJ is the device currently employed in commercially available MRAM memories, its technology has benefited from extensive industrial development and is now fairly mature, and its performance and characteristics are well-understood. While its status as the incumbent technology makes it the most likely candidate for a Josephson-MRAM memory in the short term, it is possible that the MTJ could be replaced in the longer term by another type of two-terminal magnetoresistive element. For instance, a number of magnetoresistive elements based on superconducting phenomena are currently under development. If one of these devices were developed to maturity and shown to have performance or manufacturability advantages over the MTJ, it could be substituted for the MTJ in each memory cell.

While the foregoing is directed to embodiments of the present invention, other and further embodiments of the invention may be devised without departing from the basic scope thereof. Various embodiments presented herein, or portions thereof, may be combined to create further embodiments. Furthermore, terms such as top, side, bottom, front, back, and the like are relative or positional terms and are used with respect to the exemplary embodiments illustrated in the figures, and as such these terms may be interchangeable.

What is claimed is:

1. A method for accessing a memory cell in a memory array comprising a plurality of memory cells, the method comprising:
   suppressing a critical current of a superconducting element in a row of the memory array in which the memory cell resides, wherein the superconducting element is connected to a voltage source along a first path to pass a first current sourced from a current flowing along a read bit line associated with a column of the memory array in which the memory cell resides;
   measuring a resistance across the read bit line, where the resistance includes a resistance of the superconducting element and a resistance of a magnetoresistive element that is connected to the voltage source along a second path separate from the first path to pass a second current sourced from the current flowing along the read bit line; and
   detecting a binary state of the memory cell in accordance with the resistance.

2. The method of claim 1, wherein the column is formed by wiring the plurality of memory cells in series along the read bit line.

3. The method of claim 1, wherein suppressing critical current comprises:
   applying a nonzero current to a read word line associated with the row.

4. The method of claim 3, wherein the measuring the resistance comprises:
   applying a voltage across the read bit line; and
   detecting a current resulting from the voltage.

5. The method of claim 4, wherein the detecting the current resulting from the voltage comprises:
   applying the voltage to a first end of the read bit line;
   connecting a second end of the read bit line to a current comparator; and
   calculating the current resulting from the voltage as a current resulting from a resistance state of the magnetoresistive element relative to a threshold current of the current comparator.

6. The method of claim 5, wherein the detecting the binary state of the memory cell comprises:
   producing a binary zero when the current resulting from the resistance state of the magnetoresistive element is below the threshold current of the current comparator; and
   producing a binary one when the current resulting from the resistance state of the magnetoresistive element is above the threshold current of the current comparator.

7. The method of claim 5, wherein the voltage is a direct current voltage.

8. The method of claim 5, wherein the voltage is a pulsed voltage.

9. The method of claim 8, wherein a timing of the pulsed voltage is synchronized with a timing of the current comparator.

10. The method of claim 5, wherein the current comparator is a Josephson current comparator.

11. The method of claim 4, wherein the detecting the current resulting from the voltage comprises:
    detecting the current resulting from the voltage at a point along the read bit line by an inductive coupling to a Josephson circuit.

12. The method of claim 1, wherein the measuring the resistance comprises:
    applying a nonzero current to a read bit line associated with the column; and
    detecting a voltage drop resulting from the applying.

13. The method of claim 1, wherein the magnetoresistive element is a magnetic tunnel junction.

14. The method of claim 1, wherein the magnetoresistive element is a two-terminal magnetoresistive element.

15. The method of claim 1, wherein the superconducting element is a Josephson junction.

16. The method of claim 1, wherein the superconducting element is a superconducting quantum interference device.

17. The method of claim 1, wherein the superconducting element is a rapid single flux quantum device.

18. The method of claim 1, wherein the memory array is a two-dimensional memory array.

19. The method of claim 1, wherein the suppressing is performed without suppressing critical currents of superconducting elements residing in different rows of the memory array.

20. The method of claim 1, wherein the suppressing the critical current comprises driving the superconducting element out of a zero resistance state.

* * * * *